United States Patent
Lai et al.

(10) Patent No.: US 11,616,360 B2
(45) Date of Patent: Mar. 28, 2023

(54) INTEGRATED CIRCUIT WITH CAPABILITY OF INHIBITING ESD ZAP

(71) Applicant: eMemory Technology Inc., Hsin-Chu (TW)

(72) Inventors: Chih-Wei Lai, Hsinchu County (TW); Yun-Jen Ting, Hsinchu County (TW); Yi-Han Wu, Hsinchu County (TW); Kun-Hsin Lin, Hsinchu County (TW); Hsin-Kun Hsu, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 17/481,341

(22) Filed: Sep. 22, 2021

(65) Prior Publication Data
US 2022/0158446 A1      May 19, 2022

Related U.S. Application Data

(60) Provisional application No. 63/113,978, filed on Nov. 16, 2020.

(51) Int. Cl.
*H02H 9/04* (2006.01)
*H01L 27/02* (2006.01)

(52) U.S. Cl.
CPC ......... *H02H 9/046* (2013.01); *H01L 27/0266* (2013.01)

(58) Field of Classification Search
CPC . H02H 9/046; H01L 27/0266; H01L 27/0288; H01L 27/11521; H01L 27/11526; H01L 27/11548

USPC .......................................................... 361/56
See application file for complete search history.

(56) References Cited

U.S. PATENT DOCUMENTS

| | | | |
|---|---|---|---|
| 5,625,522 A * | 4/1997 | Watt | H01L 27/0251 361/111 |
| 7,660,087 B2 | 2/2010 | Huang et al. | |
| 7,911,752 B1 * | 3/2011 | Lin | H02H 9/046 361/56 |
| 9,893,518 B2 * | 2/2018 | Braun | H02H 9/046 |
| 10,546,619 B2 | 1/2020 | Lai et al. | |
| 11,025,054 B2 * | 6/2021 | Ting | H02H 9/046 |
| 2005/0083623 A1 * | 4/2005 | Yeh | H01L 27/0259 361/56 |

(Continued)

FOREIGN PATENT DOCUMENTS

CN         209045551 U   *   6/2019   ......... H01L 27/0266

*Primary Examiner* — Dharti H Patel
(74) *Attorney, Agent, or Firm* — WPAT, PC

(57) ABSTRACT

An integrated circuit is provided. An ESD inhibition circuit of the integrated circuit is connected with a first pad, a first node and a second node. The ESD inhibition circuit includes a capacitor bank, a resistor, a voltage selector and a switching transistor. The capacitor bank is connected between the first pad and a third node. The resistor is connected between the third node and the first node. The two input terminals of the voltage selector are connected with the third node and a fourth node, respectively. An output terminal of the voltage selector is connected with a fifth node. A first terminal of the switching transistor is connected with the first pad. A second terminal of the switching transistor is connected with the second node. A gate terminal of the switching transistor is connected with the fifth node.

8 Claims, 5 Drawing Sheets

(56) References Cited

U.S. PATENT DOCUMENTS

| | | | |
|---|---|---|---|
| 2009/0168280 A1* | 7/2009 | Huang | H02H 9/046 |
| | | | 361/56 |
| 2010/0328827 A1* | 12/2010 | Lai | H02H 9/044 |
| | | | 361/56 |
| 2013/0163131 A1* | 6/2013 | Gist, III | H01L 27/0285 |
| | | | 361/56 |
| 2013/0258533 A1* | 10/2013 | Chen | H02H 9/046 |
| | | | 361/56 |
| 2019/0165571 A1* | 5/2019 | Batra | H01L 27/0288 |
| 2019/0326750 A1* | 10/2019 | Ting | H02H 9/046 |
| 2020/0083704 A1* | 3/2020 | Huang | H01L 27/0285 |
| 2020/0395752 A1* | 12/2020 | Lai | G11C 16/26 |

* cited by examiner

INTEGRATED CIRCUIT WITH CAPABILITY OF INHIBITING ESD ZAP

This application claims the benefit of U.S. provisional application Ser. No. 63/113,978, filed Nov. 16, 2020, the subject matters of which are incorporated herein by references.

FIELD OF THE INVENTION

The present invention relates to an integrated circuit, and more particularly to an integrated circuit with the capability of inhibiting the electrostatic discharge (ESD) zap.

BACKGROUND OF THE INVENTION

For increasing the operating speed and the integration level of integrated circuits, the sizes of the semiconductor devices are gradually decreased. For example, as the size of a CMOS IC is gradually decreased, the gate oxide layer becomes thinner and thinner. Consequently, the breakage voltage of the gate oxide layer is reduced, and the breakage voltage at the PN junction of the semiconductor device is also reduced. For example, the operating voltage of the MOS transistor fabricated by a low voltage device manufacturing process is 1.8V, and this MOS transistor can withstand the voltage stress of 4.5V.

As known, during the manufacturing process of the integrated circuit, an ESD zapping effect may lead to damage of the integrated circuit. Since the ESD voltage is very high, an ESD current is generated. The integrated circuit (IC) is equipped with an ESD protection circuit. The ESD protection circuit provides an ESD current path. Since the ESD current flows through the ESD current path, the internal circuit of the integrated circuit is not damaged by the ESD current.

FIG. 1A is a schematic circuit diagram illustrating a conventional integrated circuit. The integrated circuit 100 comprises an internal circuit 140 and an ESD protection circuit 110. A pad 150 is connected with a node d. The pad 150 receives a supply voltage Vpp. The node g receives the supply voltage GND. For example, the supply voltage GND is 0V.

The ESD protection circuit 110 and the internal circuit 140 are connected between the pad 150 and the node g. During the normal working state, the supply voltage Vpp is transmitted from the pad 150 to the ESD protection circuit 110 and the internal circuit 140. The supply voltage GND is transmitted to the ESD protection circuit 110 and the internal circuit 140 through the node g. Since the internal circuit 140 receives the supply voltage Vpp and the supply voltage GND, the internal circuit 140 can be operated normally. Under this circumstance, the ESD protection circuit 110 is disabled.

FIG. 1B is a schematic circuit diagram illustrating the operations of the conventional integrated circuit when the ESD zap is received. When the pad 150 receives the ESD zap, the pad 150 receives an ESD voltage $V_{ESD}$. Meanwhile, the ESD protection circuit 110 is enabled, and an ESD current $I_{ESD}$ is transmitted to the node g through the ESD protection circuit 110. In other words, when the pad 150 receives the ESD zap, the ESD protection circuit 110 is enabled to provide the ESD current path. Consequently, the ESD current $I_{ESD}$ can be transmitted to the node g through the ESD current path.

However, if the ESD protection circuit 110 is unable to be enabled immediately when the pad 150 receives the ESD zap, a portion of the ESD current $I_{ESD}$ (i.e., the portion indicated by the dotted line) flows through the internal circuit 140 to result in the damage of the internal circuit 140.

For example, in case that the internal circuit 140 comprises a memory cell array and the ESD current $I_{ESD}$ flows into the internal circuit 140, the memory cells of the memory cell array may be falsely programmed. For example, in case that the internal circuit 140 comprises a logic circuit and the ESD current $I_{ESD}$ flows into the internal circuit 140, the logic circuit is possibly damaged.

FIG. 2 is a schematic circuit diagram of a conventional ESD protection circuit. The ESD protection circuit is disclosed in U.S. Pat. No. 10,546,619 for example. The ESD protection circuit 400 comprises a voltage divider 310, a RC circuit 320, a path control circuit 230, a switching transistor Msw and an inverter 446.

The ESD protection circuit 400 is connected between a pad 250 and a node g. The pad 250 receives a supply voltage Vpp. The node g receives a supply voltage GND. The supply voltage Vpp is transmitted from the pad 250 to the ESD protection circuit 400. The supply voltage GND is transmitted to the ESD protection circuit 400 and the internal circuit 240 through the node g. For example, the supply voltage GND is 0V.

The voltage divider 310 is connected between the pad 250 and the node g. The voltage divider 310 comprises plural P-type transistors Ma, Mb and Mc. The P-type transistors Ma, Mb and Mc may be considered as three resistors that are serially connected between the pad 250 and the node g. Since the plural P-type transistors Ma, Mb and Mc are in diode connection, these transistors may be considered as resistors that are serially connected between the pad 250 and the node g. The node a generates a divided voltage Va. The node b generates a divided voltage Vb.

The RC circuit 320 is connected between the pad 250 and the node g. The RC circuit 320 comprises plural transistors Md, Me, Mf and Mg. The P-type transistor Md may be considered as a resistor that is connected between the pad 250 and a node c. The P-type transistors Me, Mf and Mg may be considered as capacitors that is connected between the node c and the node g. The node c generates a control voltage Vc.

The path control circuit 230 comprises plural P-type transistors M1, M2 and M3. A first drain/source terminal and a body terminal of the P-type transistor M1 are connected with the pad 250. A gate terminal of the P-type transistor M1 is connected with the node c. A first drain/source terminal and a body terminal of the P-type transistor M2 are connected with a second drain/source terminal of the P-type transistor M1. A gate terminal of the P-type transistor M2 is connected with the node a. A first drain/source terminal and a body terminal of the P-type transistor M3 are connected with a second drain/source terminal of the P-type transistor M2. A gate terminal of the P-type transistor M3 is connected with the node b. A second drain/source terminal of the P-type transistor M3 is connected with the node g. Moreover, the P-type transistors M1, M2 and M3 have parasitic diodes Dp1, Dp2 and Dp3, respectively.

The input terminal of the inverter 446 is connected with the node c so as to receive the control voltage Vc. A first power terminal of the inverter 446 is connected with the pad 250. A second power terminal of the inverter 446 is connected with the node b to receive the divided voltage Vb. A first drain/source terminal and a body terminal of the switching transistor Msw are connected with the pad 250. A second drain/source terminal of the switching transistor Msw is connected with the node d. A gate terminal of the switching transistor Msw is connected with the output terminal of the inverter 446. The internal circuit 240 is connected between the node d and the node g.

When the integrated circuit is in the normal working state, the voltage divider 310 and the RC circuit 320 are unable to trigger the path control circuit 230. The first power terminal of the inverter 446 receives the supply voltage Vpp. The second power terminal of the inverter 446 receives the divided voltage Vb. When the input terminal of the inverter 446 receives the supply voltage Vpp in a high level state, the output terminal of the inverter 446 generates the divided voltage Vb in a low level state. Since the gate terminal of the switching transistor Msw receives the divided voltage Vb in the low level state, the switching transistor Msw is turned on. Consequently, the pad 250 and the node d are connected with each other through the switching transistor Msw. Meanwhile, the supply voltage Vpp can be transmitted to the internal circuit 240.

In the power off condition, the integrated circuit is disabled. The supply voltage Vpp is not received by the pad 250. The gate terminal of the switching transistor Msw is in a floating state. Meanwhile, the switching transistor Msw is turned off. Consequently, the pad 250 and the node d are isolated from each other through the switching transistor Msw.

When the pad 250 receives the ESD zap, the pad 250 receive an ESD voltage. Meanwhile, the voltage divider 310 and the RC circuit 320 trigger the path control circuit 230. Consequently, the ESD current is transferred to the node g through the path control circuit 230.

Since the first power terminal of the inverter 446 receives the ESD voltage and the input terminal of the inverter 446 receives the low level, the gate terminal of the switching transistor Msw receives the high voltage level from the inverter 446. Consequently, the switching transistor Msw is turned off, and the pad 250 and the node d are continuously isolated from each other through the switching transistor Msw.

In other words, when the pad 250 receives the ESD zap, the path control circuit 230 provides an ESD current path and the switching transistor Msw isolates the pad 250 from the node d. Since the ESD protection circuit 400 is capable of effectively preventing the ESD current from flowing into the internal circuit 240, the internal circuit 240 will not be damaged by the ESD current.

In the ESD protection circuit 400 of FIG. 2, the inverter 446 and the switching transistor Msw are used to inhibit the ESD current. However, this design cannot be applied to other ESD protection circuits.

SUMMARY OF THE INVENTION

The present invention provides an integrated circuit with the capability of inhibiting electrostatic discharge (ESD) zap. The integrated circuit includes an ESD inhibition circuit. The ESD inhibition circuit cooperates with a proper ESD protection circuit to prevent the ESD current from flowing into the internal circuit.

An embodiment of the present invention provides an integrated circuit with capability of inhibiting electrostatic discharge (ESD) zap. The integrated circuit includes an ESD protection circuit, an internal circuit and an ESD inhibition circuit. The ESD protection circuit is connected between a first pad and a first node. The internal circuit is connected between a second node and the first node. The ESD inhibition circuit is connected with the first pad, the first node and the second node. The ESD inhibition circuit includes a capacitor bank, a resistor, a voltage selector and a switching transistor. The capacitor bank is connected between the first pad and a third node. The resistor is connected between the third node and the first node. A first input terminal of the voltage selector is connected with the third node. A second input terminal of the voltage selector is connected with a fourth node. An output terminal of the voltage selector is connected with a fifth node. A first terminal of the switching transistor is connected with the first pad. A second terminal of the switching transistor is connected with the second node. A gate terminal of the switching transistor is connected with the fifth node. The first input terminal of the voltage selector receives a first input voltage. The second input terminal of the voltage selector receives a second input voltage. If the first input voltage is higher than the second input voltage, the first input voltage is selected by the voltage selector and transmitted to the output terminal of the voltage selector. If the second input voltage is higher than the first input voltage, the second input voltage is selected by the voltage selector and transmitted to the output terminal of the voltage selector.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
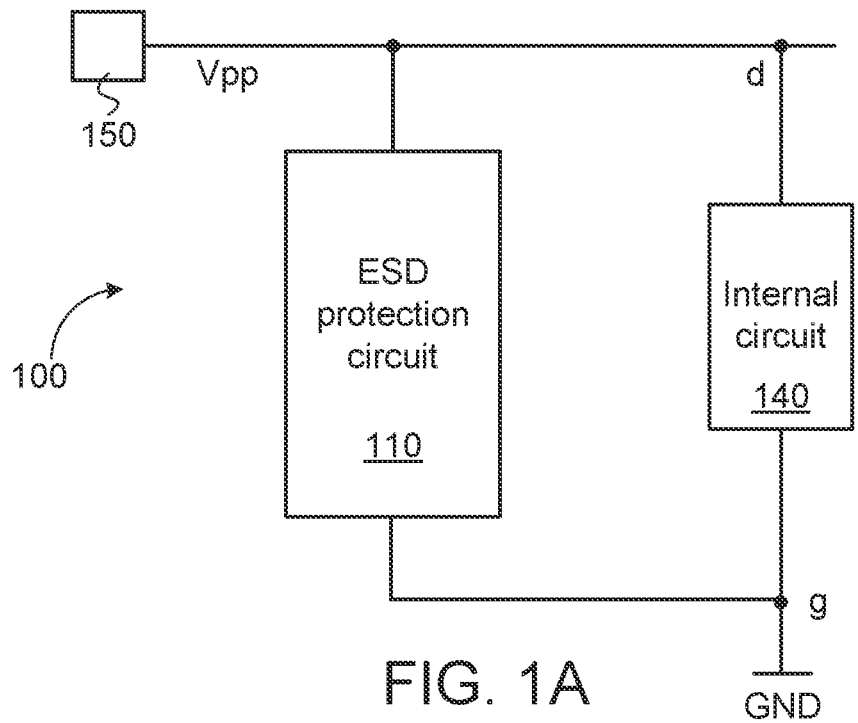
FIG. 1A (prior art) is a schematic circuit diagram illustrating a conventional integrated circuit.
Figure 1B:
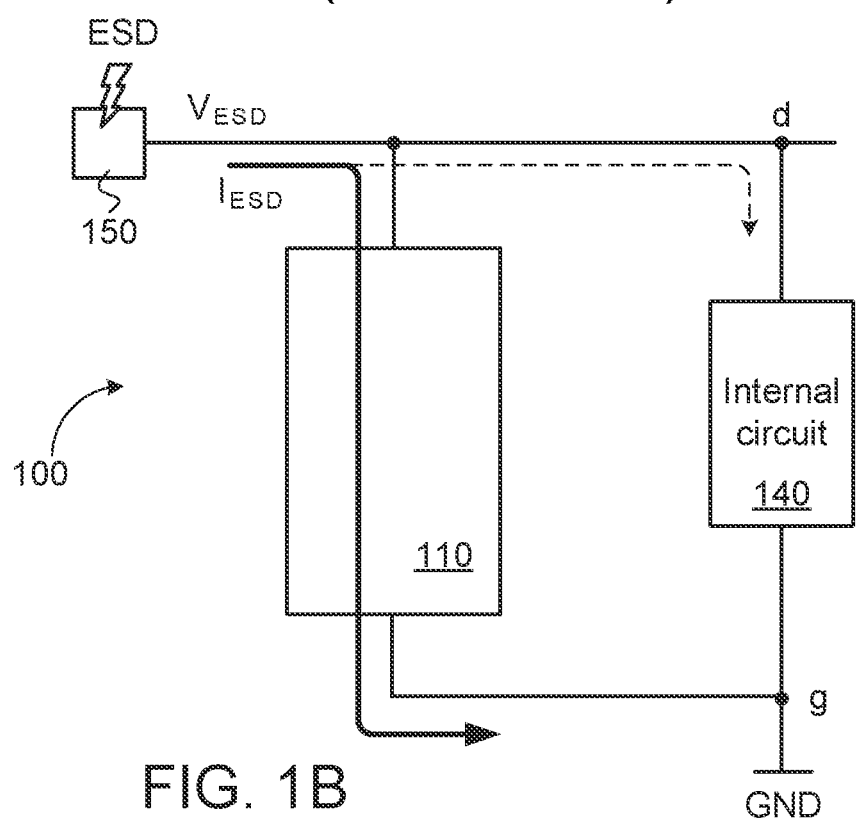
FIG. 1B (prior art) is a schematic circuit diagram illustrating the operations of the conventional integrated circuit when the ESD zap is received.
Figure 2:
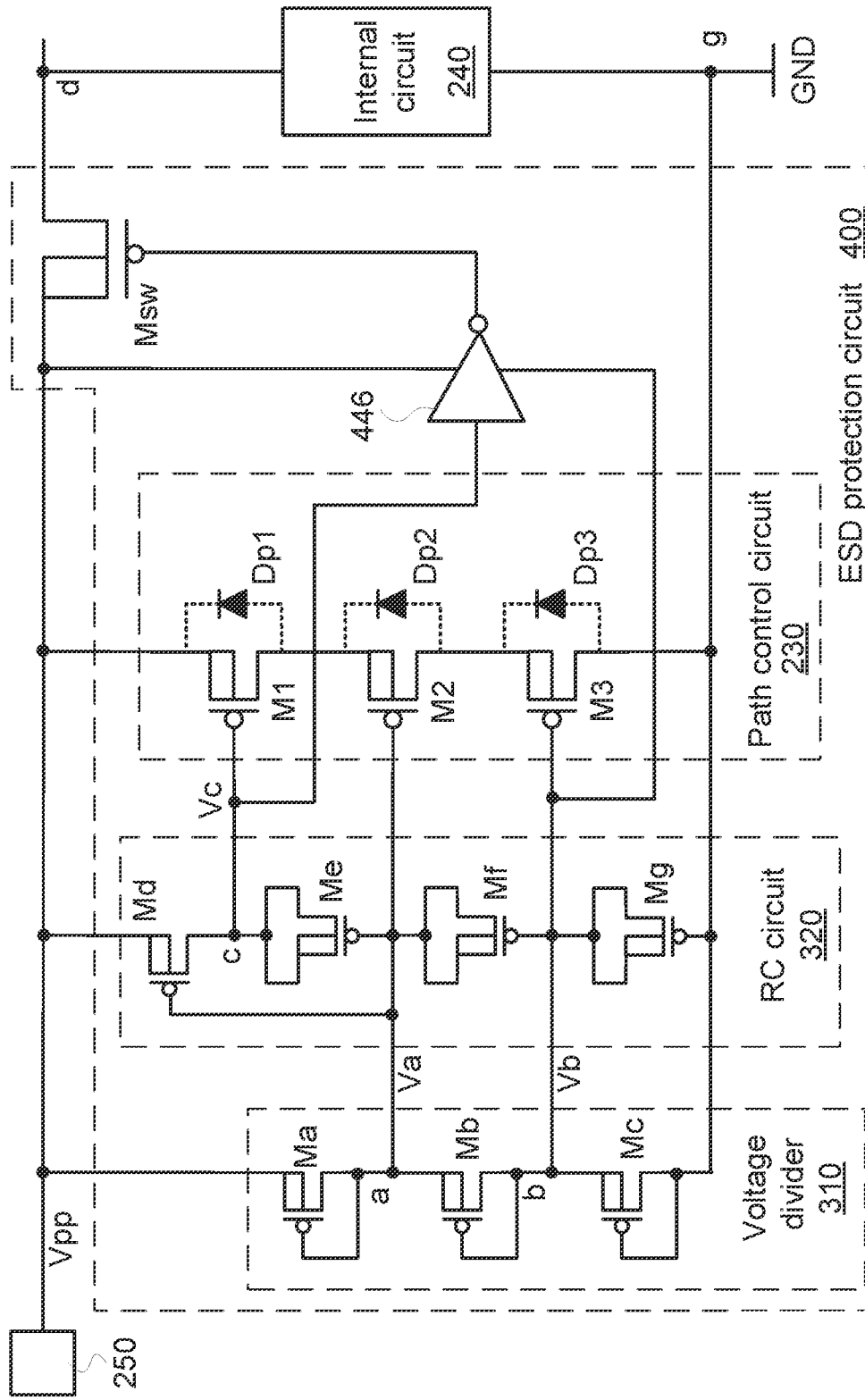
FIG. 2 (prior art) is a schematic circuit diagram of a conventional ESD protection circuit.
Figure 3:
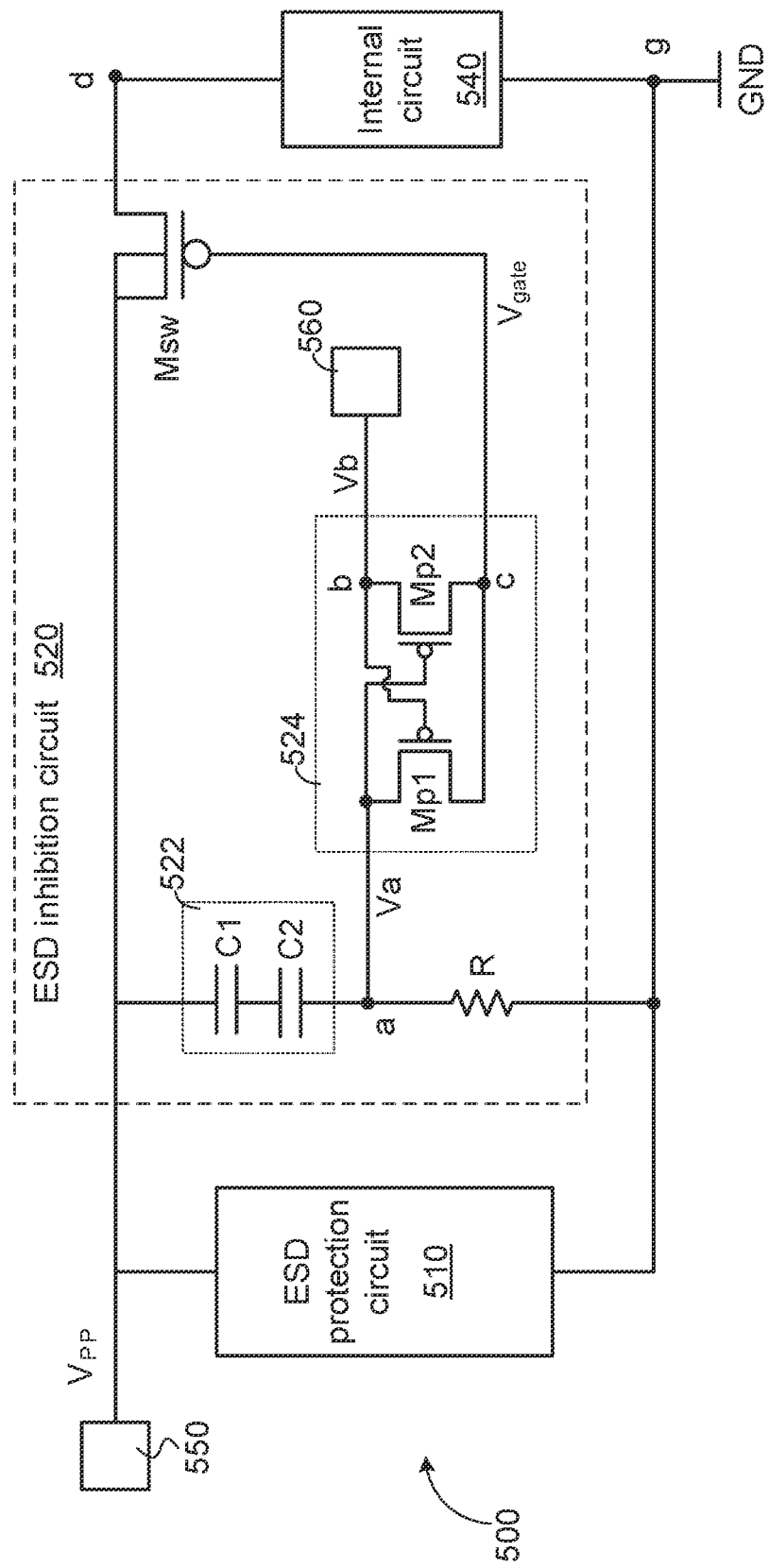
FIG. 3 is a schematic circuit diagram illustrating an integrated circuit with an ESD inhibition circuit according to an embodiment of the present invention.

FIG. 3 is a schematic circuit diagram illustrating an integrated circuit with an ESD inhibition circuit according to an embodiment of the present invention. As shown in FIG. 3, the integrated circuit 500 comprises an internal circuit 540, an ESD inhibition circuit 520 and an ESD protection circuit 510. A first pad 550 receives a supply voltage Vpp. A second pad 560 receives a supply voltage Vb. A node g receives a supply voltage GND. The supply voltage Vpp is higher than the supply voltage Vb. The supply voltage Vb is higher than the supply voltage GND. For example, the supply voltage Vpp is 4.5V, the supply voltage Vb is 1.8V, and the supply voltage GND is 0V.

The ESD protection circuit 510 is connected between the first pad 550 and the node g. The supply voltage Vpp is transmitted from the first pad 550 to the ESD protection circuit 510. The supply voltage GND is transmitted to the ESD protection circuit 510 through the node g. When the first pad 550 receives the ESD zap, the ESD protection circuit 510 provides an ESD current path. Consequently, the ESD current is transmitted from the first pad 550 to the node g through the ESD current path.

The ESD inhibition circuit 520 is connected with the first pad 550, the second pad 560, the node d and the node g. The ESD inhibition circuit 520 comprises a capacitor bank 522, a resistor R, a voltage selector 524 and a switching transistor Msw.

The two input terminals of the voltage selector 524 are connected to the node a and the node b, respectively. The voltage output terminal of the voltage selector 524 is connected with the node c. The node b is connected with the second pad 560. That is, the voltage Vb of the node b is equal to the supply voltage Vb. In an embodiment, the two input terminals of the voltage selector 524 respectively receive two input voltages, i.e., the voltage Va of the node a and the voltage Vb of the node b. In addition, a higher voltage of the voltage Va and the voltage Vb is selected and transmitted to the output terminal of the voltage selector 524 by the voltage selector 524.

The voltage selector 524 comprises a transistor Mp1 and a transistor Mp2. The transistor Mp1 and the transistor Mp2 are P-type transistors. The first terminal of the transistor Mp1 is connected with the node a. The second terminal of the transistor Mp1 is connected with the node c. The gate terminal of the transistor Mp1 is connected with the node b. The first terminal of transistor Mp2 is connected with the node b. The second terminal of the transistor Mp2 is connected with the node c. The gate terminal of the transistor Mp2 is connected with the node a.

In an embodiment, the higher voltage of the voltage Va and the voltage Vb is selected and transmitted to the node c by the voltage selector 524. For example, if the voltage Va of the node a is higher than the voltage Vb of the node b, the transistor Mp2 is turned off and transistor Mp1 is turned on. The voltage Va of the node a is transmitted to the node c. Consequently, the voltage $V_{gate}$ of the node c is equal to the voltage Va of the node a. Whereas, if the voltage Vb of the node b is higher than the voltage Va of the node a, the transistor Mp2 is turned on and transistor Mp1 is turned off. The voltage Vb of the node b is transmitted to the node c. Consequently, the voltage $V_{gate}$ of the node c is equal to the voltage Vb of the node b.

The capacitor bank 522 and the resistor R are serially connected between the first pad 550 and the node g. The first terminal of the capacitor bank 522 is connected with the first pad 550. The second terminal of the capacitor bank 522 is connected with the node a. The first terminal of the resistor R is connected with the node a. The second terminal of the resistor R is connected with the node g. In this embodiment, the capacitor bank 522 comprises two capacitors C1 and C2. The two capacitors C1 and C2 are serially connected between the first pad 550 and the node a. It is noted that the constituent the capacitor bank 522 is not restricted. For example, in another embodiment, the capacitor bank 522 comprises a single capacitor and the single capacitor is connected between the first pad 550 and the node a. In a further embodiment, the capacitor bank 522 comprises two capacitors and the two capacitors are connected between the first pad 550 and the node a in parallel.

The first terminal and the body terminal of the switching transistor Msw are connected with the first pad 550. The second terminal of the switching transistor Msw is connected with the node d. The gate terminal of the switching transistor Msw is connected with the output terminal of the voltage selector 524 to receive the voltage $V_{gate}$ of the node c. Moreover, the internal circuit 240 is connected between the node d and the node g.

When the integrated circuit is in the normal working state, the ESD protection circuit 510 is disabled. In the ESD inhibition circuit 520, the voltage Va of the node a is equal to the supply voltage GND and the voltage of the node b is equal to the supply voltage Vb. Since the supply voltage Vb is higher, the supply voltage Vb is selected as the voltage $V_{gate}$ of the node c by the voltage selector 524 and transmitted to the gate terminal of the switching transistor Msw. That is, the voltage $V_{gate}$ of the node c is equal to the supply voltage Vb. In addition, the first terminal of the switching transistor Msw receives the supply voltage Vpp, and the gate terminal of the switching transistor Msw receives the supply voltage Vb. Consequently, the switching transistor Msw is turned on. Under this circumstance, the supply voltage Vpp is transmitted to the internal circuit 540. Consequently, the internal circuit 540 is operated normally.

In an embodiment, the switching transistor Msw is a MOS transistor fabricated by a low voltage device manufacturing process. For example, the operating voltage of the MOS transistor can withstand the voltage stress of 4.5V. In any situation, the voltage difference between the first terminal and the gate terminal of the switching transistor Msw must be lower than the voltage stress that the switching transistor Msw can withstand (i.e., 4.5V), otherwise the switching transistor Msw will be damaged. For example, in case that the supply voltage Vpp is 4.5V, the supply voltage Vb is 1.8V. Alternatively, in case that the supply voltage Vpp is 6.0V, the supply voltage Vb is 2.0V.

In the power off condition, the integrated circuit is disabled. The supply voltage Vpp is not received by the first pad 550. The supply voltage Vb is not received by the second pad 560. The gate terminal of the switching transistor Msw is in a floating state. Meanwhile, the switching transistor Msw is turned off. Consequently, the first pad 550 and the node d are isolated from each other through the switching transistor Msw.

Figure 4:
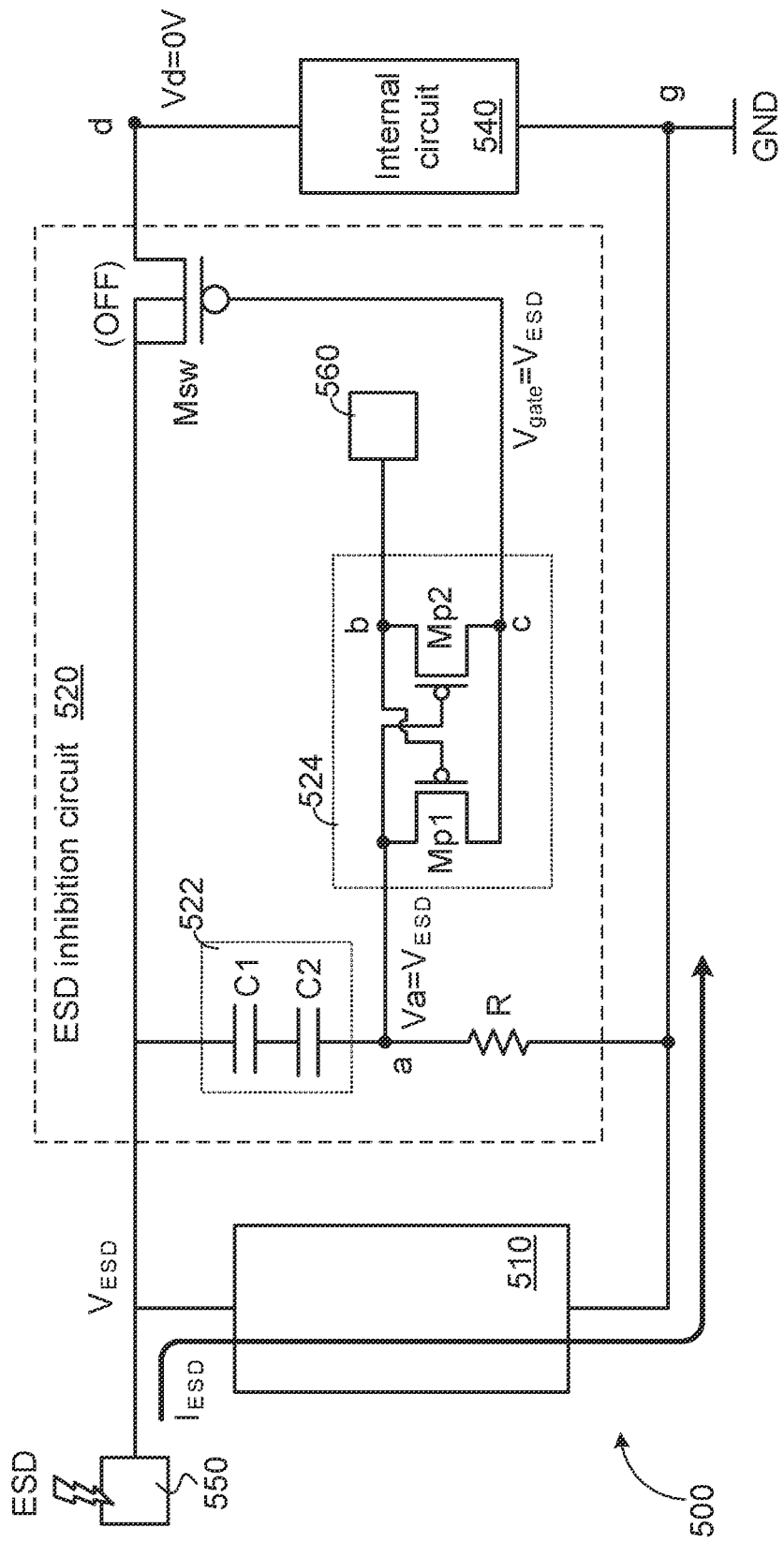
FIG. 4 is a schematic circuit diagram illustrating the operations of the integrated circuit of the present invention when the ESD zap is received.

FIG. 4 is a schematic circuit diagram illustrating the operations of the integrated circuit of the present invention when the ESD zap is received. When the pad 550 receives the ESD zap, the pad 550 receives an ESD voltage $V_{ESD}$. Meanwhile, the ESD protection circuit 510 is enabled, and an ESD current $I_{ESD}$ is transmitted to the node g through the ESD protection circuit 510. In other words, when the first pad 550 receives the ESD zap, the ESD protection circuit 510 is enabled to provide the ESD current path. Consequently, the ESD current $I_{ESD}$ can be transmitted to the node g through the ESD current path.

Moreover, at the moment when first pad 550 receives the ESD zap, the capacitor bank 522 is temporarily in a short-circuited state. Meanwhile, the voltage Va of the node a is equal to the ESD voltage $V_{ESD}$. Since the ESD voltage $V_{ESD}$ is higher, the ESD voltage $V_{ESD}$ is selected as the voltage $V_{gate}$ of the node c by the voltage selector 524 and transmitted to the gate terminal of the switching transistor Msw. That is, the voltage $V_{gate}$ of the node c is almost equal to the ESD voltage $V_{ESD}$. In addition, the first terminal and the gate terminal of the switching transistor Msw receive the ESD voltage $V_{ESD}$. Consequently, the switching transistor Msw is turned off. Under this circumstance, the first pad 550 and the node d are isolated from each other through the switching transistor Msw. Since the ESD inhibition circuit 520 is capable of effectively preventing the ESD current from flowing into the internal circuit 540, the internal circuit 540 will not be damaged by the ESD current.

Figure 5:
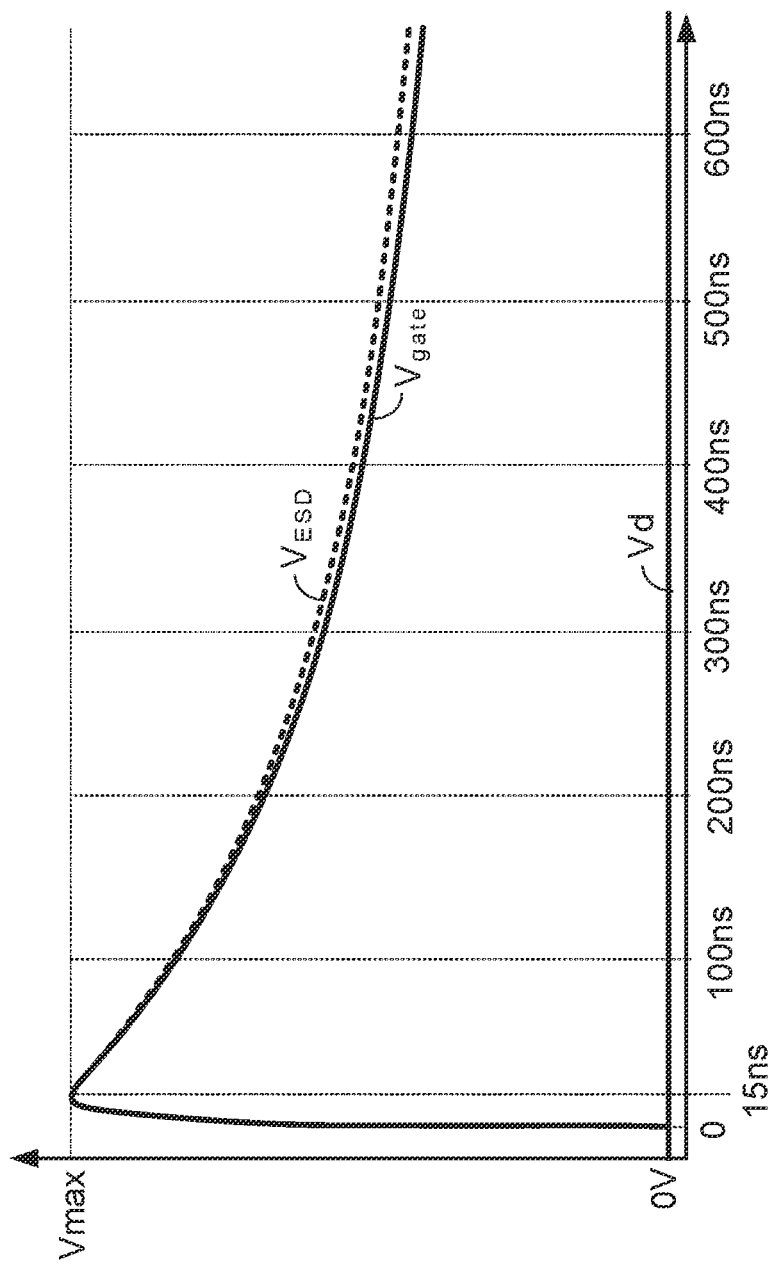
FIG. 5 is a plot illustrating the changes of the associated voltages when a human body mode (HBM) test is performed on the integrated circuit.

FIG. 5 is a plot illustrating the changes of the associated voltages when a human body mode (HBM) test is performed on the integrated circuit.

The results of the human body mode (HBM) test can be seen in FIG. 5. When an electrostatic voltage of 2 kV is applied to the first power pad 550, the ESD voltage $V_{ESD}$ is increased to the maximum voltage Vmax within 15 ns. The ESD current $I_{ESD}$ is conducted from the ESD current path to the node g. Consequently, the ESD voltage $V_{ESD}$ is gradually decreased.

Moreover, since the ESD voltage $V_{ESD}$ is higher, the ESD voltage $V_{ESD}$ is selected as the voltage $V_{gate}$ of the node c by the voltage selector 524 of the ESD inhibition circuit 520 and transmitted to the gate terminal of the switching transistor Msw. That is, the voltage $V_{gate}$ of the node c is almost equal to the ESD voltage $V_{ESD}$. Consequently, the switching transistor Msw is completely turned off. When the switching transistor Msw is turned off, the ESD current $I_{ESD}$ cannot be transmitted to the internal circuit 540. Since the voltage Vd of the node d is maintained at 0V, the purpose of effectively preventing from the damage of the internal circuit 540 is achieved.

Moreover, the example of the ESD protection circuit 510 in the integrated circuit 500 is not restricted. That is, the ESD inhibition circuit 520 of the integrated circuit 500 can cooperate with any type of the ESD protection circuit 510 as long as the ESD protection circuit 510 has the capability of providing the ESD current path and conducting the ESD current to the node g in response to the ESD zap.

From the above description, the present invention provides the integrated circuit with the capability of inhibiting the ESD zap. The integrated circuit 500 comprises the ESD protection circuit 510 and the ESD inhibition circuit 520. When the first pad 550 receives the ESD zap, the ESD protection circuit 510 provides the ESD current path. Consequently, the ESD current is conducted from the first pad 550 to the node g. In addition, the first pad 550 and the node d are isolated from each other through the switching transistor Msw of the ESD inhibition circuit 520. Since the ESD inhibition circuit 520 is capable of effectively preventing the ESD current from flowing into the internal circuit 540, the internal circuit 540 will not be damaged by the ESD current.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated circuit with capability of inhibiting electrostatic discharge (ESD) zap, the integrated circuit comprising:
   an ESD protection circuit connected between a first pad and a first node;
   an internal circuit connected between a second node and the first node; and
   an ESD inhibition circuit connected with the first pad, the first node and the second node, wherein the ESD inhibition circuit comprises:
   a capacitor bank connected between the first pad and a third node;
   a resistor connected between the third node and the first node;
   a voltage selector, wherein a first input terminal of the voltage selector is connected with the third node, a second input terminal of the voltage selector is connected with a fourth node, the fourth node is connected with a second pad, and an output terminal of the voltage selector is connected with a fifth node; and
   a switching transistor, wherein a first terminal of the switching transistor is connected with the first pad, a second terminal of the switching transistor is connected with the second node, and a gate terminal of the switching transistor is connected with the fifth node,
   wherein the first input terminal of the voltage selector receives a first input voltage, and the second input terminal of the voltage selector receives a second input voltage, wherein if the first input voltage is higher than the second input voltage, the first input voltage is selected by the voltage selector and transmitted to the output terminal of the voltage selector, wherein if the second input voltage is higher than the first input voltage, the second input voltage is selected by the voltage selector and transmitted to the output terminal of the voltage selector.

2. The integrated circuit as claimed in claim 1, wherein the first pad receives a first supply voltage, the second pad receives a second supply voltage, and the first node receives a third supply voltage, wherein the first supply voltage is higher than the second supply voltage, and the second supply voltage is higher than the third supply voltage.

3. The integrated circuit as claimed in claim 2, wherein a voltage difference between the first supply voltage and the second supply voltage is lower than a voltage stress that the switching transistor withstands.

4. The integrated circuit as claimed in claim 1, wherein a body terminal of the switching transistor is connected with the first pad.

5. The integrated circuit as claimed in claim 1, wherein the capacitor bank comprises a first capacitor and a second capacitor, and the first capacitor and the second capacitor are serially connected between the first pad and the third node.

6. The integrated circuit as claimed in claim 1, wherein the voltage selector comprises:
   a first transistor, wherein a first terminal of the first transistor is connected with the third node, a second terminal of the first transistor is connected with the fifth node, and a gate terminal of the first transistor is connected with the fourth node; and
   a second transistor, wherein a first terminal of second transistor is connected with the fourth node, a second terminal of the second transistor is connected with the fifth node, and a gate terminal of the second transistor is connected with the third node.

7. The integrated circuit as claimed in claim 6, wherein the first transistor and the second transistor are P-type transistors.

8. The integrated circuit as claimed in claim 1, wherein when the first pad receives the ESD zap, the ESD protection circuit provides an ESD current path, an ESD current is conducted to the first node through the ESD current path, and the first pad and the second node are isolated from each other through the switching transistor of the ESD inhibition circuit.

* * * * *